United States Patent
Lin et al.

(10) Patent No.: US 8,268,541 B2
(45) Date of Patent: Sep. 18, 2012

(54) MASK AND BLANK STORAGE INNER GAS

(75) Inventors: Cheng-Ming Lin, Siluo Township, Yunlin County (TW); Chue San Yoo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 739 days.

(21) Appl. No.: 11/733,471

(22) Filed: Apr. 10, 2007

(65) Prior Publication Data
US 2008/0206683 A1    Aug. 28, 2008

Related U.S. Application Data

(60) Provisional application No. 60/892,046, filed on Feb. 28, 2007.

(51) Int. Cl.
*G03F 7/20* (2006.01)
(52) U.S. Cl. ..................................... 430/322
(58) Field of Classification Search .......... 430/311, 430/322, 5; 355/53, 75
See application file for complete search history.

(56) References Cited

U.S. PATENT DOCUMENTS 6,542,220 B1     4/2003   Schrijver et al.
2001/0026355 A1*   10/2001   Aoki et al. ..................... 355/30

OTHER PUBLICATIONS

Jaehyuck Choi et al., "Real Time Analysis of the Haze Environment Trapped Between the Pellicle Film and the Mask Surface," Photomask, SPIE, Bellingham, WA, Sep. 2006, vol. 22, Issue 9, 4 pgs.
Parigger, Christian, et al., "Temperature Measurements From First-Negative N2 Spectra Produced by Laser-Induced Multiphoton Ionization and Optical Breakdown of Nitrogen", Applied Optics, vol. 34, No. 18, Jun. 20, 1995, pp. 3331-3335.

* cited by examiner

*Primary Examiner* — Brittany Raymond
(74) *Attorney, Agent, or Firm* — Haynes and Boone, LLP

(57) ABSTRACT

The present disclosure provides a lithography apparatus. The lithography apparatus includes a radiation source providing a radiation energy with a wavelength selected from the group consisting of 193 nm, 248 nm, and 365 nm; a lens system configured approximate to the radiation source; a mask chamber proximate to the lens system, configured to hold a mask and operable to provide a single atom gas to the mask chamber; and a substrate stage configured to hold a substrate and receive the radiation energy through the lens system and the mask during an exposing process.

10 Claims, 3 Drawing Sheets

MASK AND BLANK STORAGE INNER GAS

CROSS-REFERENCE

This application claims the benefit of U.S. Provisional Application 60/892,046 entitled "MASK AND BLANK STORAGE INNER GAS," filed Feb. 28, 2007, herein incorporated by reference in its entirety.

BACKGROUND

Semiconductor photolithography processes utilize photomask for patterning. Integrated circuit (IC) technology is continually progressing to circuit layouts having smaller feature sizes as well as increased density. As a result of this continuous progression, haze contamination to the masks becomes an issue, which reduces the imaging resolution and causes patterning defects.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

DETAILED DESCRIPTION

The present disclosure relates generally to lithography systems and a method of utilizing such systems for mask storage. It is understood, however, that the following disclosure provides many different embodiments, or examples, for implementing different features of the invention. Specific examples of components and arrangements are described below to simplify the present disclosure. These are, of course, merely examples and are not intended to be limiting.

Figure 1:
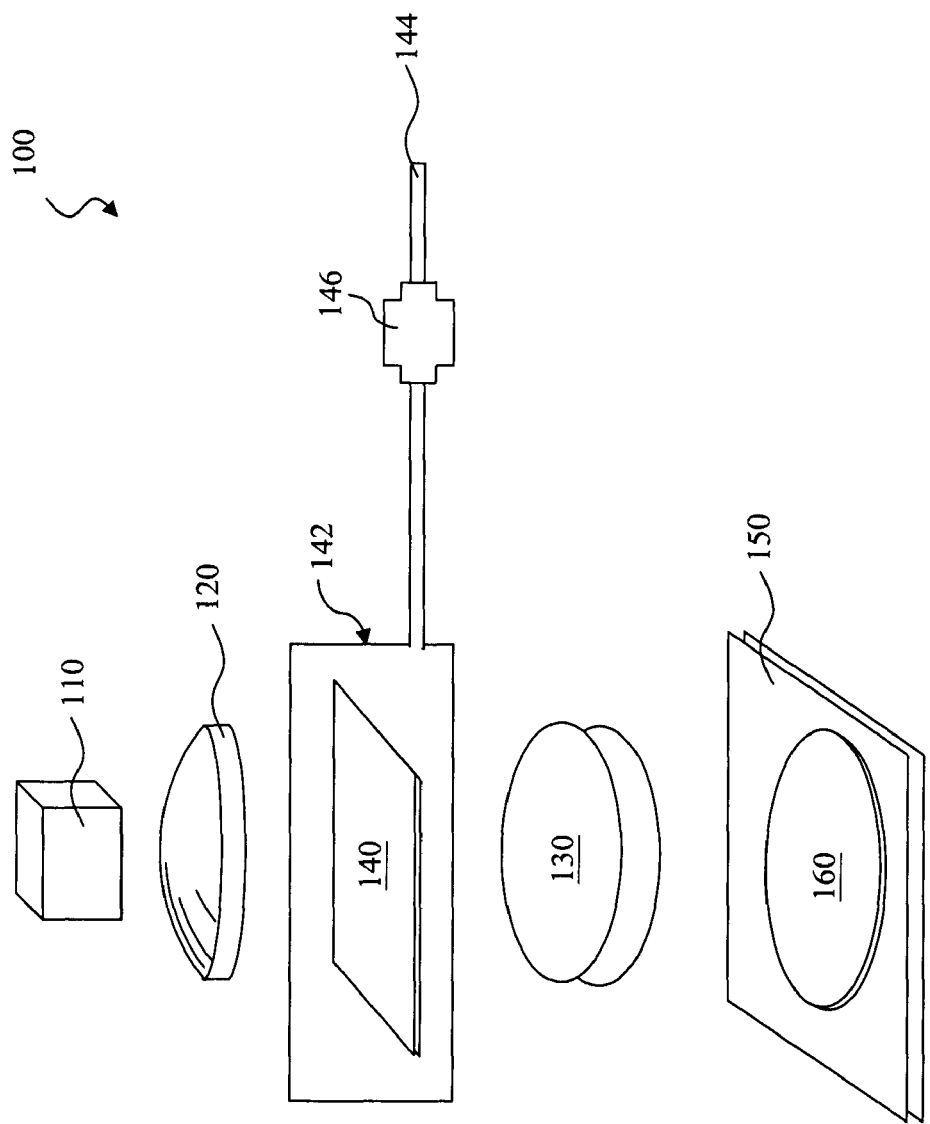
FIG. 1 is a schematic view of an exemplary embodiment of a lithography apparatus designed for a single atom gas mask storage.

Referring to FIG. 1, illustrated is a schematic view of an exemplary embodiment of a lithography apparatus 100. The lithography apparatus 100 is configured and designed to provide a single atom gas to a mask positioned therein during a lithography process, as discussed in greater detail below.

The lithography apparatus 100 includes a radiation source 110 to provide radiation beams (radiation energy). The radiation source 110 may be a suitable light source such as an ultra-violet (UV), or deep ultra-violet (DUV) source. More specifically, the radiation source 110 may be, a mercury lamp having a wavelength of 365 nm (I-line); a Krypton Fluoride (KrF) excimer laser with wavelength of 248 nm; or an Argon Fluoride (ArF) excimer laser with a wavelength of 193 nm.

The lithography apparatus 100 includes an illumination module (e.g., a condenser) 120 having a single lens, or multiple lenses and other lens components. For example, the illumination module 120 may include microlens arrays, shadow masks, or other structures designed to aid in directing radiation beams from the radiation source 110 onto a photomask ("mask" or "reticle").

The lithography apparatus 100 also includes an imaging lens module 130. The imaging lens module 130 may have a single lens or a plurality of lens elements configured to project the radiation beam onto a substrate.

A mask 140 is utilized in the lithography apparatus 100 during a lithography patterning process and may be positioned between the illumination module 120 and the imaging lens module 130. The mask 140 is enclosed in a mask chamber 142 filled with a single atom gas including argon (Ar), and/or helium (He). The lithography apparatus 100 may further include a configured structure operable to provide the single atom gas to the mask chamber 142. In one embodiment, the lithography apparatus 100 includes a pipe 144 and a valve 146 configured to provide the single atom gas to the mask chamber 142. The mask chamber 142 may be further maintained at a preset pressure, such as the atmospheric pressure, with the single atom gas.

Figure 2:
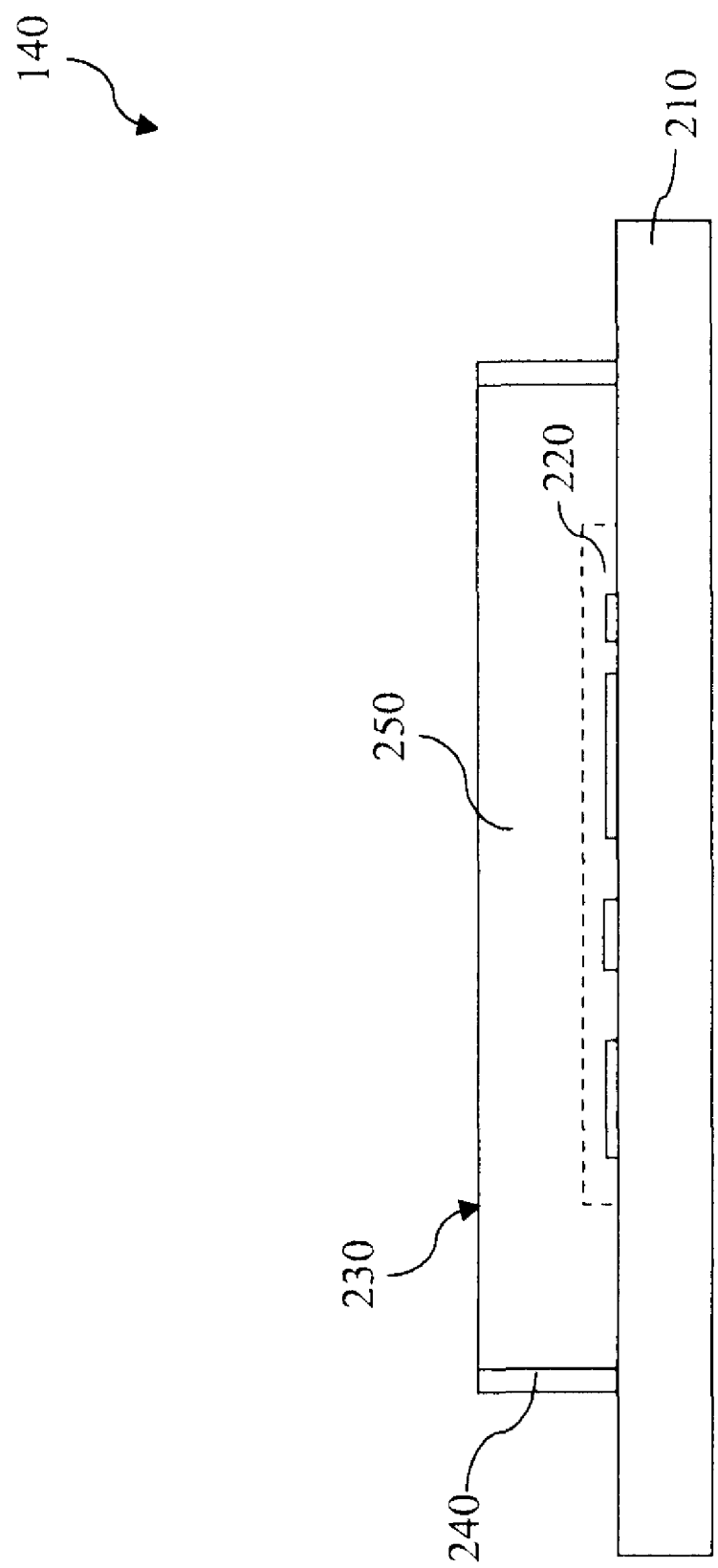
FIG. 2 illustrates a sectional view of one embodiment of a photomask constructed according to aspects of the present disclosure.

As further illustrated in FIG. 2, the mask 140 includes a transparent substrate 210. The transparent substrate may include fused silica ($SiO_2$), borosilicate glass, or soda-lime glass. The mask 140 may further include a pre-designed mask pattern 220 formed on and/or in the substrate 210 or may only be a blank. The mask pattern 220 is designed according to integrated circuit features to be formed on a semiconductor substrate. In one embodiment, the mask pattern 220 may include an absorption layer formed using a plurality of processes and materials, such as depositing a metal film made with chromium (Cr), iron oxide, or an inorganic film made with MoSi, ZrSiO, SiN, and/or TiN. The absorption layer is patterned to have one or more openings where radiation beams may travel through without being absorbed and have one or more absorption areas where the radiation beams may be completely or partially blocked thereby. In another embodiment, the mask pattern 220 may include phase shift features formed above, on and/or at least partially in the substrate 210 by etching thereof. The pattern layer 220 may be a binary intensity mask (BIM or binary mask) including chrome areas and transparent quartz areas. In another embodiment, the mask pattern 220 may be an alternating phase shift mask (AltPSM), employing alternating areas of chrome and 180 degree-shifted quartz. In another embodiment, the mask pattern 220 may be an attenuating phase shift mask (AttPSM), employing an attenuating feature having a phase shift relative to the transparent substrate. Alternatively, the mask pattern 220 may be a chromeless phase shift pattern. In another embodiment, the mask pattern 220 may include a combination of binary features and various phase shift features. Additionally, the mask pattern 220 may include various optical proximity correction (OPC) features designed for fixing an optical proximity affect. The mask 140 is held on a mask table (not shown) and is operable to move in translational and rotational modes. The mask 140 includes a pellicle 230 secured on the substrate 210 through a pellicle frame 240 mechanically and/or chemically, such as by glue. The frame 240 may include one or more ventilation holes (not shown) for ventilation. In the present embodiment, the substrate 210, pellicle 230, and frame 240 form an enclosed mask space 250 filled with a single atom gas, selected from the group consisting of Ar and He. The lithography apparatus 100 may also include a mechanism to provide the single atom gas to the enclosed mask space 142 of the mask 140 positioned in the chamber 142 during the lithography process.

The lithography apparatus 100 may further include a mask stage (not shown) having a scan function. The mask stage is operable to hold the mask and manipulate the mask in transitional and/or rotational modes.

The lithography apparatus 100 includes a substrate stage 150 for holding a substrate 160 to be patterned and manipulating the substrate in transitional and/or rotational modes during a lithography patterning process. The substrate 160 may be a semiconductor wafer having silicon, germanium, diamond, or a compound semiconductor. The substrate 160 may alternatively include other materials such as glass for thin-film transistor liquid crystal display (TFT_LCD) devices or fused silicon/calcium fluoride for photomask. The substrate 160 may include a plurality of layers formed thereon, each having patterned structures. The substrate 160 may include a material layer formed thereon and to be patterned. The substrate 160 is further coated with an imaging layer such as photoresist for lithography patterning process. An exemplary photoresist material includes chemical amplification photoresist (CAR).

Figure 3:
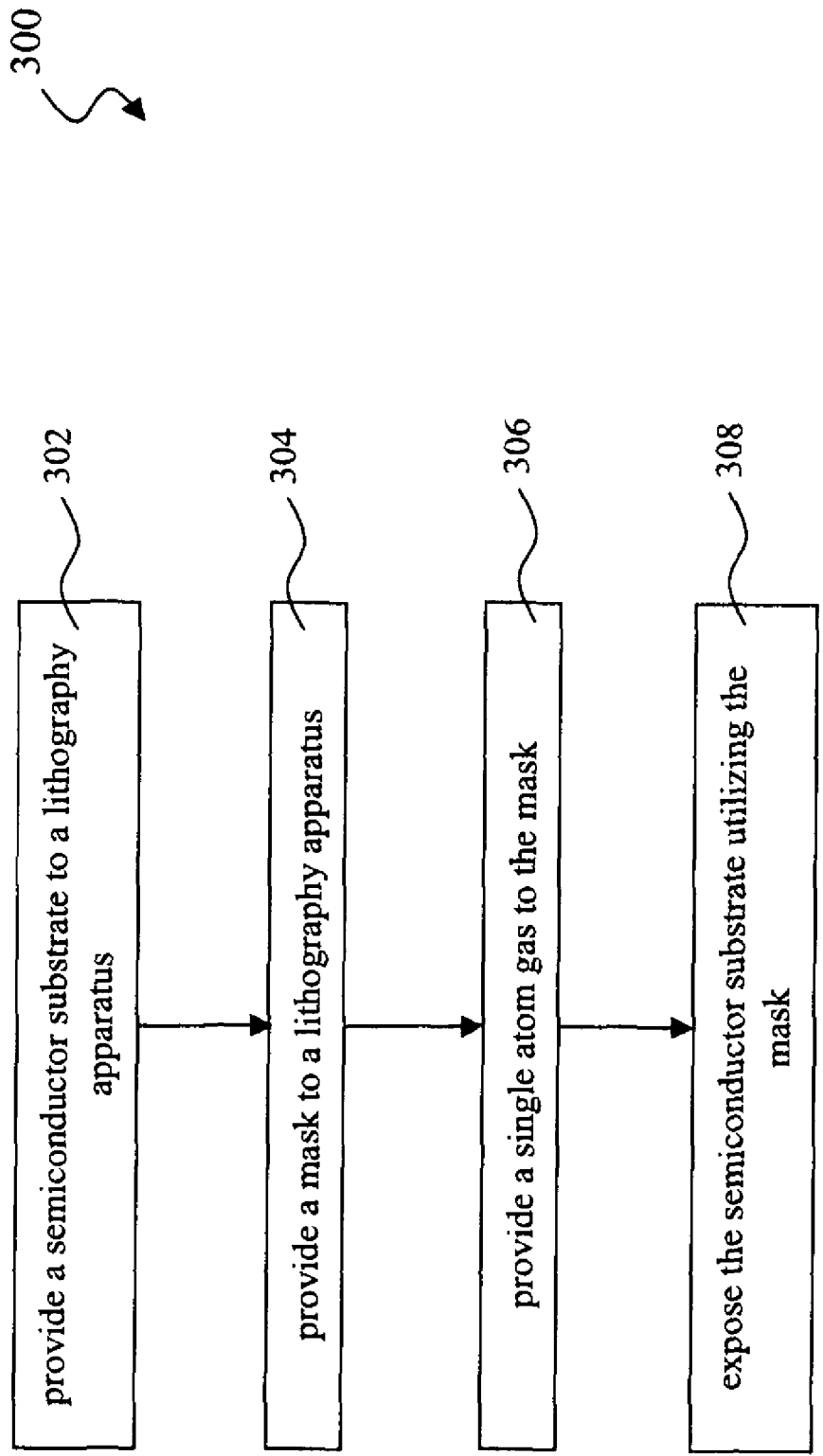
FIG. 3 is a flowchart of one embodiment of a method utilizing the lithography apparatus of FIG. 1 with the mask of FIG. 2 in a single atom gas environment.

Referring also to FIG. 3, a lithography patterning process 300 is constructed according to aspects of the present disclosure and is described below with additional reference to the FIGS. 1 and 2. The process 300 begins at step 302 by providing the exemplary substrate 160 to the lithography apparatus 100. The substrate may be a semiconductor wafer or other substrates to be patterned such as a glass substrate for TFT LCD devices or fused quartz/calcium fluoride substrate for mask. In the present example, the substrate 160 is the semiconductor wafer. The substrate 160 may further include multiple patterned layers formed therein and/or thereon such as doped regions, shallow trench isolation (STI), poly-silicon gates, and metal lines and vias. The substrate 200 may include a material layer to be patterned. The substrate 160 may be further coated with an imaging layer such as photoresist. The substrate coated with the imaging layer may be further baked. The substrate 160 is loaded to the substrate stage 150.

The process 300 proceeds to step 304 by providing the mask 140 in the lithography apparatus 100 configured to provide a single atom gas for the mask 140. In one embodiment, the mask 140 is positioned in the mask chamber 142. The mask 140 may further include a pellicle 230 for protection, defining the enclosed space 250 filled with a single atom gas.

The process 300 proceeds to step 306 by providing a single atom gas to the mask 140 such that the mask is in the single atom gas environment during the lithography process. In one embodiment, a single atom gas is provided to the mask chamber 142 through the preconfigured pipe 144 and valve 146. In another embodiment, the lithography apparatus 100 is configured to provide the single atom gas to the enclosed mask space 250 during the lithography patterning process. In another embodiment, both the enclosed mask space 250 and the mask chamber 142 are filled with the same type of a single atom gas or different types of single atom gases. The single atom gas may be continuously provided to the mask 140 (including the mask chamber 142 and/or the enclosed mask space 250) to maintain a certain pressure and compensate the loss of the single atom gas.

The process 300 proceeds to step 308 by exposing the substrate 160 utilizing the mask 140 in the single atom gas environment including the enclosed mask space filled with a single atom gas and/or the mask chamber filled with a single atom gas. During the exposure process, the radiation beam from the radiation source 110 is shined through the mask and directed toward the imaging layer of the substrate 160. In one embodiment, the radiation beam has a wavelength about 193 nm. In other embodiments, the radiation beam is selected from the group consisting of an ArF excimer laser having a wavelength of 193 nm, a KrF excimer laser having a wavelength of 248 nm, and a mercury excimer laser having a wavelength of 365 nm.

Other lithography processes may include post-exposure baking, photoresist developing, and hard baking. The lithography patterning process may further include etching and photoresist stripping.

Other embodiments are constructed according to aspects of the present disclosure. In one embodiment, when the mask 140 is waiting for later lithography processing, referred to as idle time, the enclosed mask space 250 between the substrate 210 and the pellicle 230 is filled with the single atom gas. In another embodiment, during the idle time, the mask is further positioned in a chamber or a stocker filled with and maintained with the single atom gas, in which the chamber or the stocker is designed and configured operable to provide the single atom gas thereto. The mask may have a pattern to be imaged or may only be a blank.

Haze contamination involves chemical reactions, such as among sulfur oxide, water, and ammonia, and re-deposition on the mask pattern area. The sulfur and ammonia are major components of haze source. The storage inner gas therefore is selected to be substantially free of nitrogen. The single atom gas including argon and/or helium are inert gas and can effectively protect the mask from the haze damage. The single atom gas can be used during an exposure process or during an idle time. The single atom gas can be applied in the enclosed mask space between the transparent substrate and the pellicle, and/or inside a mask chamber in a lithography apparatus. The single atom gas for the mask storage may be maintained in a temperature between a room temperature and about 100 degrees C. In one embodiment, the single atom gas including argon and/or helium may have a concentration at least about 90% in pressure of the total mask storage gas. The single atom gas for the mask storage may be maintained in a preset pressure such as the atmospheric pressure. In another embodiment, the single atom gas for the mask storage needs to be substantially free of nitrogen, carbon, and hydrogen.

The present disclosure provides various embodiments of a lithography apparatus and a method to utilize the lithography apparatus. Other variations may also be possible within the scope of the invention. The process 300 may implement the processing steps in different sequences. For example, the mask 140 is filled with the single atom gas inside the enclosed mask space 250 and them positioned in the mask chamber 142. In another example, the mask 140 is positioned in the mask chamber 142 and then filled in with the single atom gas inside the enclosed mask space 250 and the mask chamber 142. In another embodiment, a mask without an attached pellicle is positioned in the mask chamber and then the mask chamber 142 is filled with the single atom gas.

Thus, the present disclosure provides an lithography apparatus. In one embodiment, the lithography apparatus includes a radiation source providing a radiation energy with a wavelength selected from the group consisting of 193 nm, 248 nm, and 365 nm; a lens system configured approximate to the radiation source; a mask chamber proximate to the lens system, configured to hold a mask and operable to provide a single atom gas to the mask chamber; and a substrate stage configured to hold a substrate and receive the radiation energy through the lens system and the mask during an exposing process.

In some embodiments, the radiation source provides the radiation energy selected from the group consisting of an ArF excimer laser having a wavelength of 193 nm, a KrF excimer laser having wavelength of 248 nm, and a mercury excimer laser having a wavelength of 365 nm. The lens system may further include an illumination module and an imaging lens module. The lithography apparatus may further include a pipe and a valve configured to provide the single atom gas to the mask chamber. The single atom gas may be selected from the group consisting of argon, helium, and a combination thereof. The single atom gas may have a concentration at least about 90% in pressure of the total pressure in the mask chamber.

The mask further include a transparent substrate; a mask pattern defined on the transparent substrate; a pellicle positioned on the transparent substrate such that the mask pattern is enclosed between the transparent substrate and the pellicle; and a pellicle frame configured to secure the pellicle to the transparent substrate, defining an enclosed mask space between the transparent substrate and the pellicle. The enclosed mask space is filled with the single atom gas. The mask pattern may include a structure selected from the group consisting of a binary feature, a phase shift feature, an optical proximate correction feature, and combinations thereof. The lithography apparatus may further include a mechanism to provide the single atom gas to the enclosed mask space of the mask. The lithography apparatus may further include a mechanism to maintain a preset pressure of the single atom gas in the mask chamber.

The present disclosure also provide a lithography patterning process. The process includes providing a substrate to be patterned; providing a mask into a mask chamber configured in a lithography apparatus; providing a single atom gas to the mask chamber; and exposing the substrate by a radiation beam having a wavelength selected from the group consisting of 193 nm, 248 nm, and 365 nm.

In some embodiments, the single atom gas is selected from the group consisting of argon and helium. The single atom gas is provided utilizing a pipe and a valve properly configured to the lithography apparatus. The mask includes a transparent substrate; a pellicle positioned on the transparent substrate; and a pellicle frame configured to secure the pellicle to the transparent substrate, defining an enclosed mask space between the transparent substrate and the pellicle. The enclosed mask space is filled with the single atom gas. The process may include filling the single atom gas into the enclosed mask space of the mask.

The present disclosure also provides an embodiment of an integrated circuit manufacturing method. The method includes providing a mask having a transparent substrate; a pellicle positioned on the transparent substrate; and a pellicle frame configured to secure the pellicle to the transparent substrate, defining an enclosed mask space between the transparent substrate and the pellicle. The method includes filling the mask with a single atom gas in the enclosed mask space.

In some embodiments, the single atom gas is selected from the group consisting of argon and helium. The method may further include positioning the mask into a chamber or a stocker filled with the single atom gas. The mask includes a plurality of integrated circuit features to be imaged on a substrate by utilizing a radiation beam of a wavelength selected from the group consisting of 193 nm, 248 nm, and 365 nm. The filling of the mask space may include filling the single atom gas to a concentration at least about 90% in pressure of the total pressure in the mask space.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A lithography patterning process, comprising:
   providing a substrate;
   providing a mask chamber having a mask disposed therein, wherein the mask includes a transparent substrate, a pellicle positioned on the transparent substrate, and a pellicle frame configured to secure the pellicle to the transparent substrate such that an enclosed mask space is defined between the transparent substrate and the pellicle;
   continuously providing a first single atom gas that is substantially free of nitrogen into the mask chamber to maintain a first predetermined pressure within the mask chamber, such that the mask chamber has a first single atom gas environment that is substantially free of nitrogen;
   continuously providing a second single atom gas that is substantially free of nitrogen into the enclosed mask space to maintain a second predetermined pressure within the enclosed mask space, such that the enclosed mask space has a second single atom gas environment that is substantially free of nitrogen, wherein the second single atom gas is different than the first single atom gas; and
   exposing the substrate by a radiation beam having a wavelength less than or equal to 365 nm, wherein the exposing the substrate includes passing the radiation beam through the mask in the mask chamber's single atom gas environment that is substantially free of nitrogen, such that a pattern of the mask is transferred to the substrate.

2. The process of claim 1, wherein the providing of the first single atom gas comprises providing the first single atom gas selected from the group consisting of argon and helium.

3. The process of claim 1, wherein the providing of the first single atom gas comprises utilizing a pipe and a valve coupled to the mask chamber and properly configured to provide the first single atom gas to the mask chamber.

4. The process of claim 1, wherein the providing of the first single atom gas comprises providing the first single atom gas with a concentration at least about 90% in pressure of a total pressure in the mask chamber.

5. The process of claim 1, wherein the providing of the second single atom gas comprises providing the second single atom gas selected from the group consisting of argon and helium.

6. An integrated circuit manufacturing method, comprising:
   providing a mask having: a transparent substrate, a pellicle positioned on the transparent substrate, and a pellicle frame configured to secure the pellicle to the transparent substrate, such that an enclosed mask space is defined between the transparent substrate and the pellicle;
   continuously filling the enclosed mask space with a first single atom gas that is substantially free of nitrogen to maintain a first predetermined pressure;
   positioning the mask in a single atom gas environment of a mask chamber, such that the mask is in alignment with a substrate, wherein the mask chamber's gas environment is substantially free of nitrogen;
   continuously filling the mask chamber with a second single atom gas that is substantially free of nitrogen to maintain a second predetermined pressure, wherein the second single atom gas is different from the first single atom gas; and exposing the substrate using the mask in the mask chamber's gas environment that is substantially free of nitrogen.

7. The method of claim 6, wherein the filling of the enclosed mask space comprises filling the enclosed mask space with the first single atom gas selected from the group consisting of argon and helium.

8. The method of claim 6, further comprising storing the mask in a stocker filled with a single atom gas that is substantially free of nitrogen prior to positioning the mask in the mask chamber's single atom gas environment.

9. The method of claim 6, wherein the providing the mask further comprises providing the mask with a plurality of patterned features to be imaged on the substrate by a radiation beam during the exposure process, the radiation beam being of a wavelength selected from the group consisting of 193 nm, 248 nm, and 365 nm.

10. The method of claim 6, wherein the filling of the enclosed mask space comprises filling the first single atom gas to a concentration at least about 90% in pressure of a total pressure in the enclosed mask space.

* * * * *